United States Patent
Tatsumi et al.

(10) Patent No.: US 7,170,101 B2
(45) Date of Patent: Jan. 30, 2007

(54) NITRIDE-BASED SEMICONDUCTOR LIGHT-EMITTING DEVICE AND MANUFACTURING METHOD THEREOF

(75) Inventors: Masaki Tatsumi, Nara (JP); Toshio Hata, Nara (JP); Mayuko Fudeta, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 548 days.

(21) Appl. No.: 10/146,412

(22) Filed: May 14, 2002

(65) Prior Publication Data

US 2005/0051788 A1 Mar. 10, 2005

(30) Foreign Application Priority Data

May 15, 2001 (JP) .............................. 2001-144083

(51) Int. Cl.
*H01L 27/15* (2006.01)
*H01L 33/00* (2006.01)

(52) U.S. Cl. ............................ 257/94; 257/99; 257/79; 257/81; 257/624; 257/E33.03; 257/E33.062

(58) Field of Classification Search ................. 257/99, 257/94, 79, E33.03, E33.062, 81, 624
See application file for complete search history.

(56) References Cited

U.S. PATENT DOCUMENTS 5,990,500 A * 11/1999 Okazaki ....................... 257/99
2001/0045561 A1* 11/2001 Hata et al. .................... 257/79
2002/0117672 A1* 8/2002 Chu et al. ..................... 257/79

FOREIGN PATENT DOCUMENTS

| JP | 08-236271 | 9/1996 |
|---|---|---|
| JP | 09-027638 | 1/1997 |
| JP | 09170821 | 6/1997 |
| JP | 09335580 | 12/1997 |
| JP | 10-229219 | 8/1998 |
| JP | 11-274562 | 10/1999 |

(Continued)

OTHER PUBLICATIONS

English Translation of Japanese Office Action for Application No. 2001-144083 filed Nov. 11, 1999, mailed Mar. 1, 2005, three pages.

(Continued)

*Primary Examiner*—Kenneth Parker
*Assistant Examiner*—Joseph Nguyen
(74) *Attorney, Agent, or Firm*—Morriston & Foerster LLP (57) ABSTRACT

A nitride-based semiconductor light-emitting device includes a light-emitting element having an n-GaN substrate and a nitride-based semiconductor multilayer film formed on the n-GaN substrate. The n-GaN substrate of the light-emitting element is fixed to a mount surface. The n-GaN substrate has one surface with the nitride-based semiconductor multilayer film formed thereon and an opposite surface with a metal layer and an ohmic electrode formed thereon. The metal layer contains a first metal and a second metal and the ohmic electrode is formed of the second metal. The adhesion between the ohmic electrode and the n-GaN substrate is thus improved. Accordingly, the semiconductor light-emitting device which is highly reliable with respect to the thermal strain from the mount surface can be provided.

4 Claims, 4 Drawing Sheets

FOREIGN PATENT DOCUMENTS

| | | |
|---|---|---|
| JP | 11-340571 | 12/1999 |
| JP | 2000-164928 | 6/2000 |
| JP | 2001-085736 A | 3/2001 |
| JP | 2001-094151 A | 4/2001 |
| JP | 2001-119103 A | 4/2001 |
| JP | 2001-156401 | 6/2001 |

OTHER PUBLICATIONS

English Translation of Japanese Office Action for Japanese Patent Application No. 2001-144083 mailed Jul. 5, 2005, four pages.

English Translation of JP 09-027638, 11 pages.

* cited by examiner

NITRIDE-BASED SEMICONDUCTOR LIGHT-EMITTING DEVICE AND MANUFACTURING METHOD THEREOF

BACKGROUND OF THE INVENTION

1. Field of the Invention

The present invention relates to nitride-based semiconductor light-emitting devices.

2. Description of the Background Art

Nitride-based semiconductor is used as a material for high-brightness blue LED (light-emitting diode) and pure green LED that have already been employed for full-color displays for example. Moreover, nitride-based semiconductor is being developed for use in a semiconductor laser as a short-wavelength light source, for the purpose of increasing the storage capacity of an optical disk. These devices have been formed on an insulating sapphire substrate, and thus it is impossible to direct electric current from the rear side of the substrate. Accordingly, p-type and n-type electrodes are formed on the front side, which requires a complicated process for fabricating the electrodes.

According to recently presented reports about fabrication of semiconductor lasers and LEDs, a mask member is partially formed on a sapphire substrate for growth thereon (selective lateral growth), and then a high-quality n-GaN bulk crystal is produced by hydride vapor phase growth. The bulk crystal is used as a substrate having its rear side from which electric current can be directed.

Figure 6:
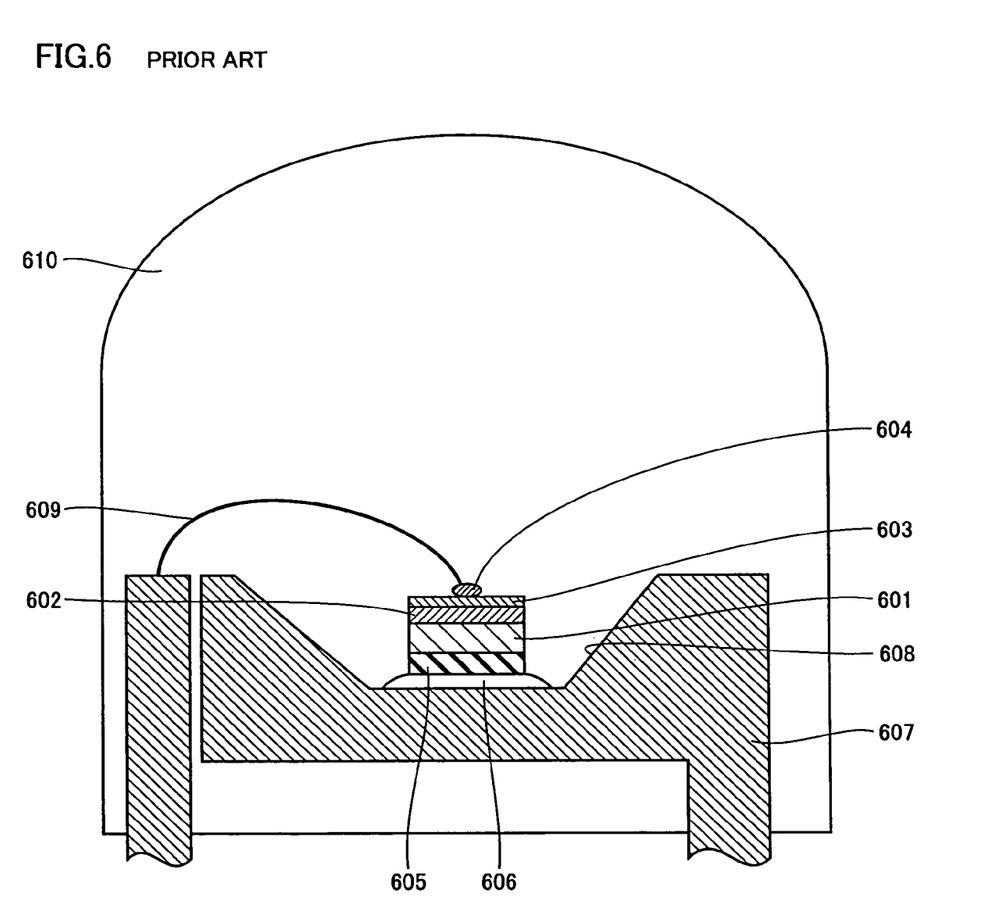
FIG. 6 shows a cross section of a conventional semiconductor light-emitting device.

FIG. 6 shows a cross section of a semiconductor light-emitting device including, as a light-emitting element, an LED chip formed of nitride-based compound semiconductor.

The LED chip includes an n-GaN substrate 601 with (0001) or c-plane on which a nitride-based compound semiconductor multilayer film 602 is formed. Nitride-based compound semiconductor multilayer film 602 includes a buffer layer, an n-GaN cladding layer, a multiple quantum well active layer, a p-AlGaN protective layer, and a p-GaN contact layer that are successively deposited. On the uppermost surface of nitride-based compound semiconductor multilayer film 602, a p-type translucent electrode 603 and a P pad electrode 604 are formed. On the rear surface of n-GaN substrate 601, an n-type electrode 605 formed of stacked Ti and Al is formed. The LED chip is 350 μm×350 μm in size.

The LED chip is attached firmly onto a cup 608 of a leadframe 607 with Ag paste 606, and the LED chip and leadframe 607 are electrically connected by P pad electrode 604 and a wire 609 and by n-type electrode 605 and Ag paste 606. Leadframe 607 with the LED chip mounted thereon and wire 609 are encapsulated in mold resin 610 to form a semiconductor light-emitting device. The semiconductor light-emitting device has characteristics that the luminance is 3.0 Cd and the operating voltage is 3.5 V at room temperature under a current of 20 mA. It is noted that the luminance and operating voltage are hereinafter represented as values measured at room temperature under a current of 20 mA.

100 semiconductor light-emitting devices as described above are prepared on which an energization test is conducted under atmospheric pressure with a constant drive current of 30 mA. After 5000 hours from the start of the test, the operating voltage of the semiconductor light-emitting devices is measured. The rate of change of the measured operating voltage relative to the operating voltage before the start of the test is +20%. Here, the rate of change is defined as a value determined by dividing, a difference between the measured operating voltage and the operating voltage before the start of the test (hereinafter pre-test voltage), by the pre-test voltage and multiplying the resultant quotient by 100. The rate of change is indicated by "+" when the voltage increases while that is indicated by "−" when the voltage decreases. The lamps (light-emitting devices) undergoing the test are disassembled and accordingly analyzed. It is found that the n-type electrode of the chip attached to the cup is on the point of peeling off. A further test and more detailed analysis prove that this peeling of the n-type electrode is caused by thermal strain from the cup surface.

SUMMARY OF THE INVENTION

According to the present invention, a nitride-based semiconductor light-emitting device includes a light-emitting element having an n-GaN substrate and a nitride-based semiconductor multilayer film formed on the n-GaN substrate. The substrate of the light-emitting element is fixed to a mount surface. The n-GaN substrate has one surface with the nitride-based semiconductor multilayer film formed thereon and an opposite surface with a metal layer and an ohmic electrode formed thereon. The metal layer contains a first metal and a second metal and the ohmic electrode is formed of the second metal.

According to the present invention, the first metal of the nitride-based semiconductor light-emitting device is one of Hf, Zr and Sc.

According to the present invention, the second metal of the nitride-based semiconductor light-emitting device is one of Al and Ag.

According to one aspect of the present invention, a method of manufacturing a nitride-based semiconductor light-emitting device is characterized in that the first metal and the second metal are simultaneously formed on the opposite surface of the n-GaN substrate and thereafter the ohmic electrode formed of the second metal is formed.

According to another aspect of the present invention, a method of manufacturing a nitride-based semiconductor light-emitting device is characterized in that films formed respectively of the first metal and the second metal are successively formed on the opposite surface of the n-GaN substrate, annealing is performed on the films to produce the metal layer containing the first metal and the second metal, and thereafter the ohmic electrode formed of the second metal is formed.

According to the present invention, the second metal is any substance which is likely to form ohmic contact with the crystal of the n-GaN substrate. However, the second metal itself is insufficient in terms of adhesion due to thermal strain from the mount surface, which would result in deterioration of the reliability. Then, the first metal is added to the second metal in a region near the interface with the n-GaN substrate so as to improve reaction between the n-GaN substrate and the second metal and thus improve adhesion. The metal layer containing the first metal and the second metal should be 10 nm or more in terms of adhesion and should be 20 nm or less for securing the ohmic contact.

Here, the mount surface refers to a surface on which a semiconductor light-emitting device including a light-emitting element is formed. Specifically, the mount surface refers to a surface of a cup of a leadframe of an LED lamp, a surface of a substrate made of liquid crystal polymer or glass epoxy resin of a surface-mount LED, a heat sink surface or submount surface of an LD, or the like.

DESCRIPTION OF THE PREFERRED EMBODIMENTS

First Embodiment

Figure 1:
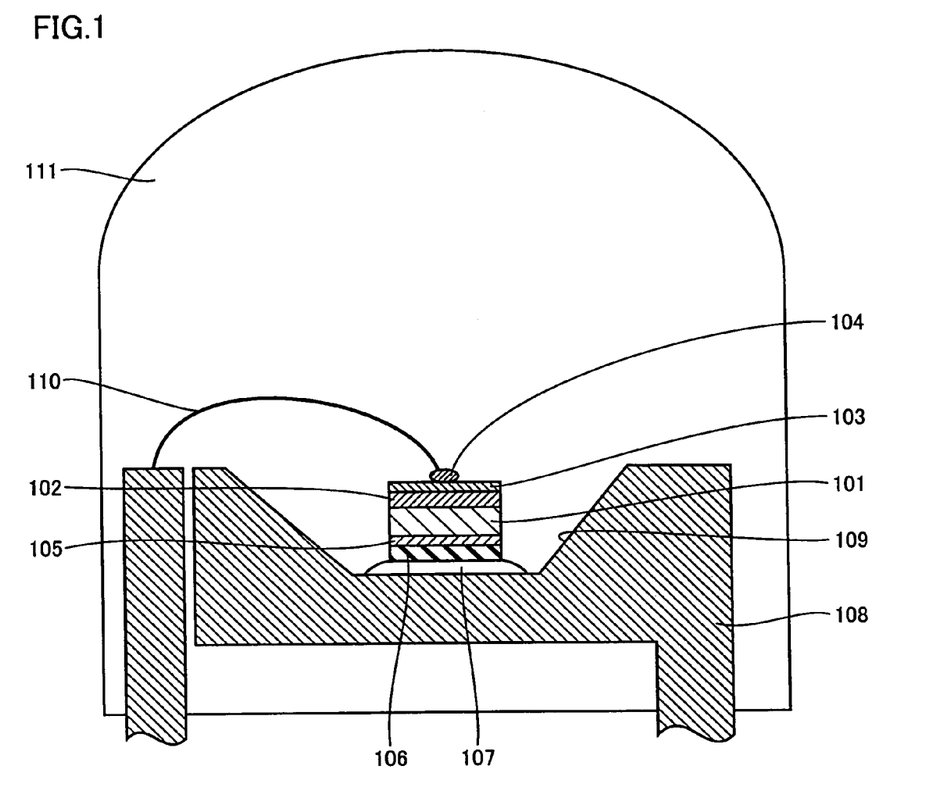
FIGS. 1 to 5 show respective cross sections of semiconductor light-emitting devices according to first to fifth embodiments of the present invention.

Referring to FIG. 1, a first embodiment of a semiconductor light-emitting device is described that includes, as a light-emitting element, an LED chip having an n-GaN substrate and a nitride-based compound semiconductor multilayer film formed on the substrate.

The LED chip includes n-GaN substrate 101 with c-plane (0001) on which nitride-based compound semiconductor multilayer film 102 is formed. Nitride-based compound semiconductor multilayer film 102 includes a buffer layer, an n-GaN cladding layer, a multiple quantum well active layer, a p-AlGaN protective layer, and a p-GaN contact layer that are successively deposited. On the topmost surface of nitride-based compound semiconductor multilayer film 102, a p-type electrode 103 and a P pad electrode 104 are formed. On the rear surface of the substrate, an n-type electrode is formed. The LED chip is 350 μm×350 μm in size.

The n-type electrode is constituted of a metal layer 105 containing a first metal and a second metal and an ohmic electrode 106 made of the second metal that is formed on metal layer 105. The second metal contained in metal layer 105 contacts n-GaN substrate 101. Here, the first metal is Hf and the second metal is Al for example and accordingly a method of fabricating the n-type electrode is described below.

An Hf layer (5 nm) and an Al layer (150 nm) are deposited successively by electron beam vapor deposition or sputter vapor deposition for example. Then, after annealing in vacuum at 500° C. conducted for 3 minutes, metal layer 105 containing Hf and Al is formed near the interface with n-GaN substrate 101. The resultant metal layer 105 is approximately 10 nm in thickness, and Hf and Al are mixed therein to contact n-GaN substrate 101. Ohmic electrode 106 is approximately 145 nm containing Al only. However, no distinguishable interface is formed between metal layer 105 and ohmic electrode 106 since the layers are individually formed and metal components contained in one layer enter the other. It is Al only that makes ohmic contact with n-GaN substrate 101. Then, Al and n-GaN substrate 101 must be in contact with each other while Al and n-GaN substrate 101 must firmly be adhered to each other. Accordingly, there must be a region where Al is adhered to n-GaN substrate 101 with Hf therebetween.

The thickness of the Hf layer should be 10 nm or less in order to allow Al to reach n-GaN substrate 101 in annealing and accordingly secure the ohmic contact. Further, the thickness of the Hf layer should be 5 nm or more in order to enhance adhesion between ohmic electrode 106 of Al and n-GaN substrate 101.

The LED chip is attached firmly onto a cup 109 of a leadframe 108 with Ag paste 107, and the LED chip and leadframe 108 are electrically connected by P pad electrode 104 and a wire 110 and by the n-type electrode and Ag paste 107. Leadframe 108 with the LED chip mounted thereon and wire 110 are encapsulated in mold resin 110 to form a semiconductor light-emitting device. The resultant semiconductor light-emitting device has characteristics that the luminance is 3.0 Cd and the operating voltage is 3.5 V.

100 semiconductor light-emitting devices as described above are prepared on which an energization test is conducted under atmospheric pressure with a constant drive current of 30 mA. After 5000 hours from the start of the test, the operating voltage of the semiconductor light-emitting devices is measured. The rate of change of the measured operating voltage relative to the operating voltage before the start of the test is within the range of ±5%.

Modifications

According to a modification to the first embodiment, a semiconductor light-emitting device includes Zr or Sc instead of Hf as the first metal. The semiconductor light-emitting device according to the modification to the first embodiment exhibits characteristics that the luminance is 3.0 Cd and the operating voltage is 3.5 V under an operating current of 20 mA in either case for Zr or Sc used as the first metal. For each of modifications to the first embodiment by Zr and Sc, 100 semiconductor light-emitting devices are prepared on which an energization test is conducted under atmospheric pressure with a constant drive current of 30 mA for measuring the operating voltage. After 5000 hours from the start of the test, the rate of change of the operating voltage is within the range of ±5% in either case for Zr or Sc used as the first metal.

Table 1 shows the operating voltage before the energization test under atmospheric pressure (pre-test operating voltage) and the rate of change of the operating voltage after 5000 hours from the start of the test according to the first embodiment and comparative examples or modifications.

TABLE 1

| | Pre-Test Operating Voltage | Rate of Change of Operating Voltage (after 5000 hrs) |
|---|---|---|
| First Embodiment | 3.5 V | within ±5% |
| Modification (Zr) | 3.5 V | within ±5% |
| Modification (Sc) | 3.5 V | within ±5% |

An Ag electrode may be used as the ohmic electrode instead of the Al electrode for the first embodiment and modifications. The Ag electrode is preferably at least 150 nm in thickness.

Second Embodiment

Figure 2:
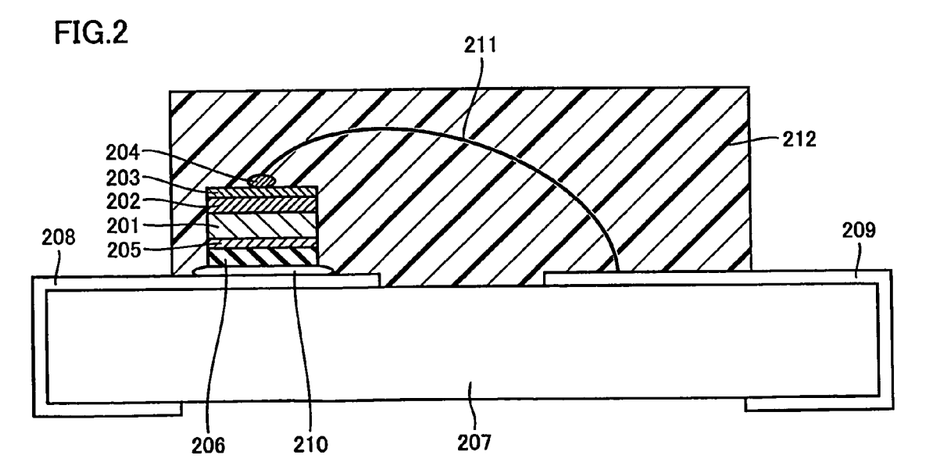

Referring to FIG. 2, a surface-mount semiconductor light-emitting device is described according to a second embodiment of the present invention. The light-emitting device includes, as a light-emitting element, an LED chip which is directly mounted on a motherboard. Here, the LED chip is the same as that of the first embodiment.

The surface-mount semiconductor light-emitting device according to the second embodiment includes an LED chip having an n-GaN substrate 201, a nitride-based compound semiconductor light-emitting element 202, a p-type electrode 203, a P pad electrode 204, a metal layer 205, and an ohmic electrode 206. Metal layer 205 contains Hf as a first metal and Al as a second metal.

On a smooth upper surface of a substrate (motherboard) 207 made of glass epoxy resin, a die bonding electrode pattern 208 and a wire bonding electrode pattern 209 are formed. The LED chip mounted on die bonding electrode pattern 208 is attached to the substrate with Ag paste 210. The LED chip and wire boding electrode pattern 209 are connected by a wire 211. Finally, the LED chip and the wire are encapsulated in epoxy resin 212.

The surface-mount LED thus produced has a luminance of 2.0 Cd and an operating voltage of 3.5 V. An energization test is performed under atmospheric pressure with a constant drive current of 30 mA. After 5000 hours from the start of the test, the rate of change of the operating voltage is within the range of ±5%.

Third Embodiment

Figure 3:
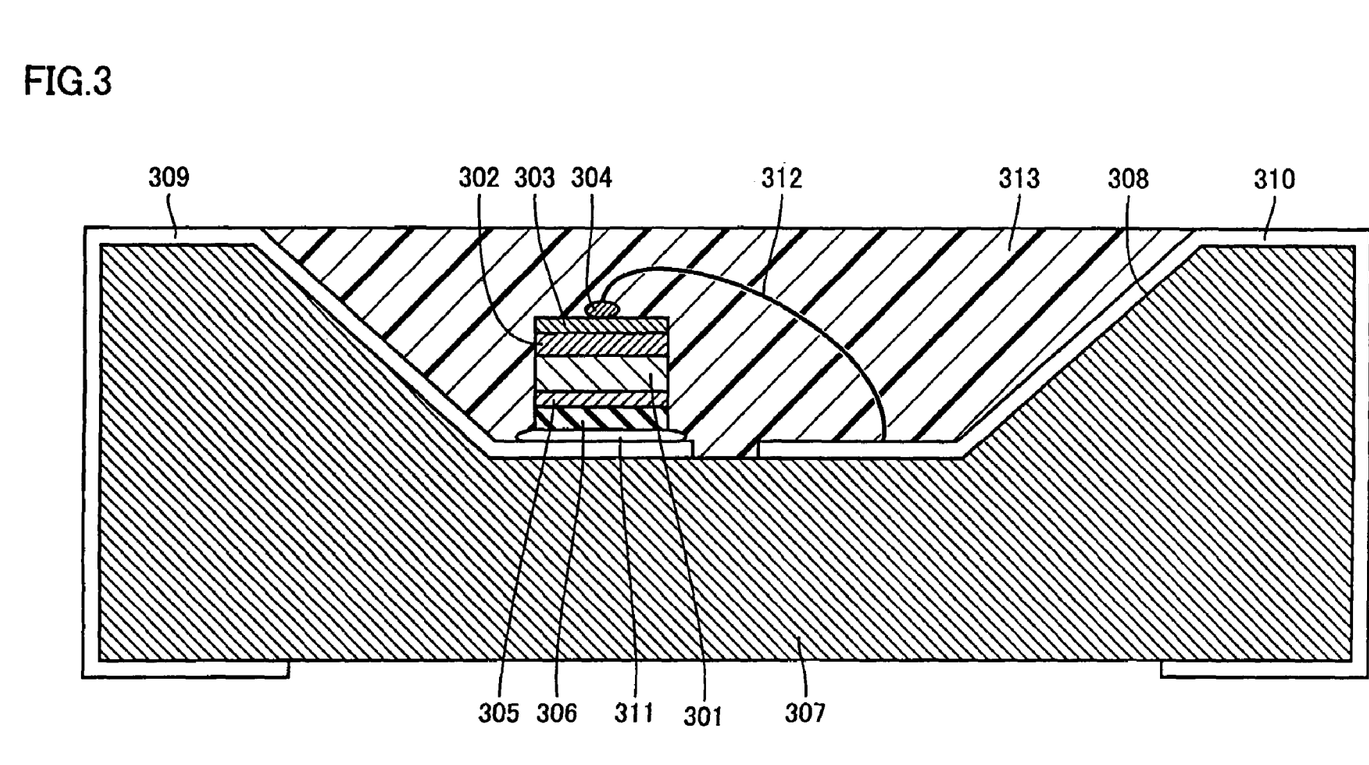

Referring to the cross sectional view of FIG. 3, a surface-mount semiconductor light-emitting device according to a third embodiment is described. The semiconductor light-emitting device includes an LED chip as a light-emitting element that is directly mounted on a motherboard. Here, the LED chip is the same as that of the first embodiment.

The surface mount semiconductor light-emitting device according to the third embodiment includes an LED chip having an n-GaN substrate 301, a nitride-based compound semiconductor light-emitting element 302, a p-type electrode 303, a P pad electrode 304, a metal layer 305, and an ohmic electrode 306. Metal layer 305 contains Hf as a first metal and Al as a second metal.

On the upper side of a block-shaped substrate (motherboard) 307 made of liquid crystal polymer, a recess 308 is formed as a reflective cup. Along the inner wall of recess 308, a die bonding electrode pattern 309 and a wire bonding electrode pattern 310 are formed. The LED chip is placed within recess 308 and firmly attached with Ag paste 311. The LED chip and wire bonding electrode pattern 310 are connected by a wire 312. Finally, the inside of recess 308 is filled with epoxy resin 313 for encapsulating the LED chip and wire 312 therein.

The surface-mount LED thus produced has a luminance of 2.5 Cd and an operating voltage of 3.5 V.

An energization test is conducted under atmospheric pressure with a constant drive current of 30 mA. After 5000 hours from the start of the test, the rate of change of the operating voltage is within the range of ±5%.

Fourth Embodiment

Figure 4:
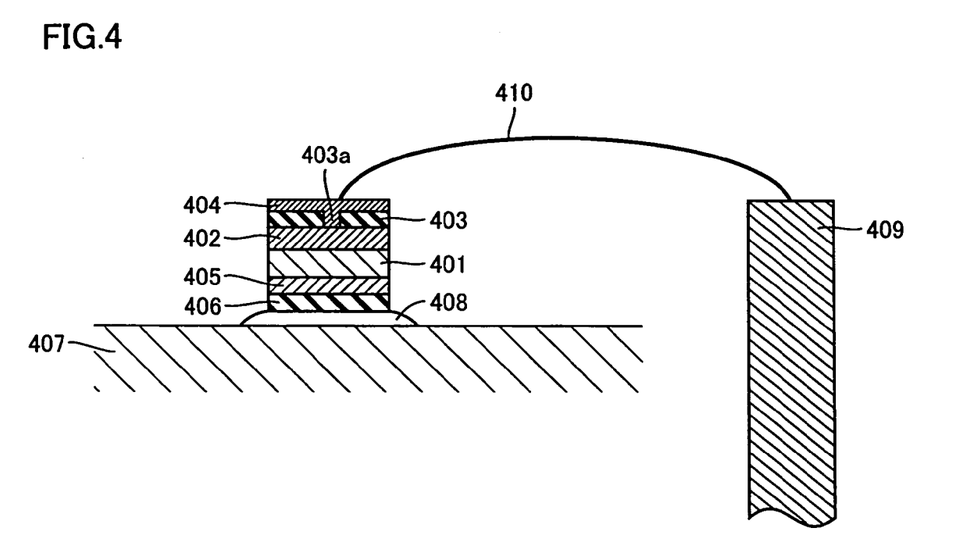

Referring to the cross sectional view of FIG. 4, a semiconductor light-emitting device according to a fourth embodiment is described. The semiconductor light-emitting device includes an LD (Laser Diode) chip as a light-emitting element that includes an n-GaN substrate and a nitride-based compound semiconductor multilayer film formed on the substrate.

The LD chip is of a current-blocking type that includes n-GaN substrate 401 with c-plane (0001) on which nitride-based compound semiconductor multilayer film 402 is formed. The nitride-based compound semiconductor multilayer film 402 includes an n-GaN contact layer, an n-InGaN anti-crack layer, an n-AlGaN cladding layer, an n-GaN optical guide layer, a multiple quantum well active layer, an AlGaN anti-evaporation layer, a p-GaN optical guide layer, a p-AlGaN cladding layer and a p-GaN contact layer that are successively deposited. On the nitride-based compound semiconductor multilayer film 402, an insulating film 403 having a stripe-shaped groove 403a for current blocking is formed. A p-type electrode 404 is formed on insulating film 403 and an exposed surface of nitride-based compound semiconductor multilayer film 402. An n-type electrode is formed on the rear surface of n-GaN substrate 401. Both end surfaces of the LD chip are cleavage surfaces in <1–100>orientation of the crystal of the n-GaN substrate. The end surfaces have no reflective film formed thereon and thus they are non-coated surfaces.

The n-type electrode is constituted of a metal layer 405 containing a first metal and a second metal and an ohmic electrode 406 formed of the second metal. The second metal contained in the metal layer 405 contacts n-GaN substrate 401.

Here, the first metal is Hf and the second metal is Al for example and accordingly a method of fabricating the n-type electrode is described below.

By simultaneous sputter vapor deposition, metal layer 405 containing Hf and Al is deposited to 10–20 nm while the substrate is heated to 300–400° C. Then, an Al layer (150 nm) is solely formed by sputter vapor deposition. Annealing is thereafter performed at 500° C. for 3 minutes. The thickness of metal layer 405 containing Hf and Al should be 10 nm or more for ensuring adhesion of the Al layer and should be 20 nm or less for securing the ohmic contact.

The LD chip has a surface on which p-type electrode 404 is formed, this surface is directed upward, and die bonding of the LD chip is accomplished on a stem 407 through thermocompression by means of a predetermined solder material 408. P-type electrode 404 and a lead terminal 409 are connected by a wire 410 and accordingly the semiconductor light-emitting device is completed.

For the semiconductor light-emitting device thus produced, its current-optical output and current-voltage characteristics are evaluated. Under the condition of continuous lasing at room temperature, the threshold current is 80 mA, the slope efficiency is 0.8 W/A, and the threshold voltage is 4 V. Under a current of 160 mA, the optical output is 5 mW and the operating voltage is 6 V. 10 semiconductor light-emitting devices as described above are prepared. Under a continuously applied constant drive current of 160 mA at room temperature for 200 hours, the rate of change of the operating voltage relative to the initial operating voltage is within the range of ±10%.

For comparison, a semiconductor laser is fabricated including a stacked Ti/Al electrode as the n-type electrode of the LD chip. Under a current of 160 mA at room temperature, the semiconductor laser has an optical output of 5 mW and the operating voltage of 6 V, that are the exactly the same characteristics as those of the semiconductor light-emitting device of this embodiment. An energization test is conducted under the conditions as described above. Then, the operating voltage increases by 30% relative to the initial operating voltage. The current is continuously applied and, after 500 hours, the device is broken due to thermal runaway.

Fifth Embodiment

Figure 5:
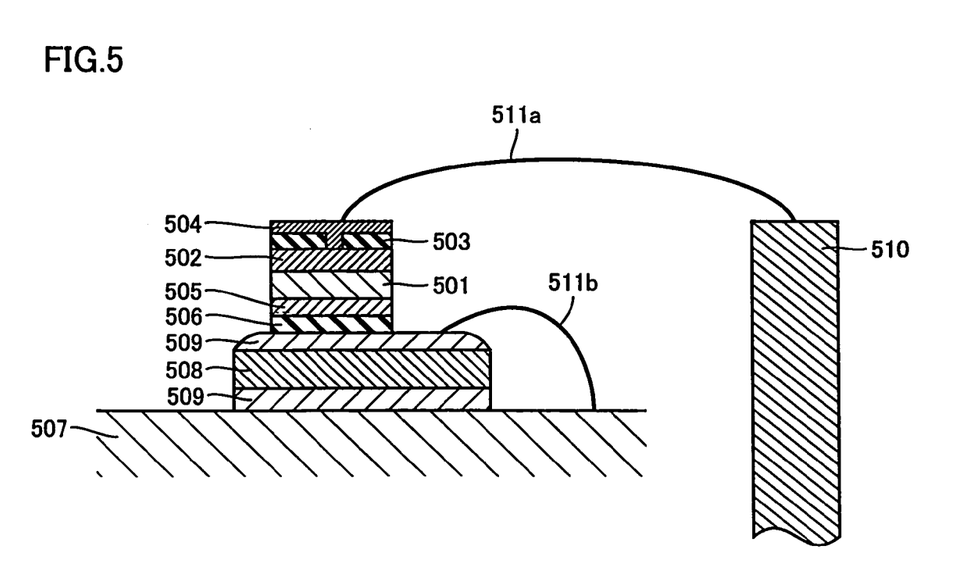

Referring to FIG. 5, a semiconductor light-emitting device is described that includes the LD chip of the fourth embodiment mounted in a manner described below.

The semiconductor light-emitting device according to this embodiment includes an LD chip having an n-GaN substrate 501, a nitride-based semiconductor multilayer film 502, an insulating film 503, a p-type electrode 504, a metal layer 505 and an ohmic electrode 506.

A submount 508 is fixed onto a stem 507, and the LD chip is mounted on submount 508 such that the surface having p-type electrode 504 formed thereon is directed upward. The upper and lower surfaces of submount 508 are coated with solder material 509 in advance. Through thermocompression, stem 507 and submount 508 as well as submount 508 and the LD chip are fusion-bonded. P-type electrode 504 and a lead terminal 510 are connected by a wire 511a and solder material 509 on the upper surface of submount 508 and stem 507 are connected by a wire 511b.

Submount 508 serves as a buffer for alleviating thermal stress caused by a difference in the thermal expansion coefficient between the LD chip and stem 507. In order not to load the LD chip, submount 508 is made of a material having a thermal expansion coefficient substantially equal to that of the LD chip and having a satisfactory thermal conductivity. The nitride-based compound semiconductor forming the LD chip has a thermal expansion coefficient of $3.4$–$4.4 \times 10^{-6}/°$ C. Then, the material of submount 508 preferably has a thermal expansion coefficient of $3$–$5 \times 10^{-6}/°$ C., and thus AlN, SiC or Si for example is preferred. The thermal conductivity is preferably at least 40 W/m/K. Here, solder material 509 is AuSn.

For the semiconductor light-emitting device thus produced, its current-optical output and current-voltage characteristics are evaluated. Under the condition of continuous lasing at room temperature, the threshold current is 80 mA, the slope efficiency is 0.8 W/A, and the threshold voltage is 4 V. Under a current of 160 mA, the optical output is 5 mW and the operating voltage is 6 V.

10 semiconductor light-emitting devices as described above are prepared. Under a continuously applied constant drive current of 160 mA at room temperature for 200 hours, the rate of change of the operating voltage relative to the initial operating voltage is within the range of ±5%.

In this way, the LD chip is mounted on stem 507 with submount 508 therebetween. The load on the n-type electrode and solder material 509 is thus alleviated and accordingly the semiconductor light-emitting device has an improved reliability of the operating voltage.

According to the present invention, a semiconductor light-emitting device includes a light-emitting element having an n-GaN substrate and a nitride-based compound semiconductor multilayer film formed on the n-GaN substrate, and the light-emitting element is placed on a mount surface. An n-type electrode is formed on the rear surface of the n-GaN substrate. The n-type electrode is constituted of a metal layer and an ohmic electrode. The metal layer contains a first metal which is any one of Hf, Zr and Sc and a second metal which makes ohmic contact with the n-GaN substrate, and the ohmic electrode is formed of the second metal. The adhesion between the ohmic electrode and the n-GaN substrate is thus improved. Accordingly, the semiconductor light-emitting device which is highly reliable with respect to the thermal strain from the mount surface can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nitride-based semiconductor light-emitting device including a light-emitting element having an n-GaN substrate and a nitride-based semiconductor multilayer film formed on said n-GaN substrate, said n-GaN substrate of said light-emitting element being fixed to a mount surface, wherein
said n-GaN substrate has one surface having said nitride-based semiconductor multilayer film formed thereon and an opposite surface having a metal layer formed thereon and an ohmic electrode formed on the metal layer, wherein the metal layer is sandwiched between the n-GaN substrate and the ohmic electrode, said metal layer containing a first metal and a second metal and said ohmic electrode being formed of the second metal.

2. The nitride-based semiconductor light-emitting device according to claim 1, wherein
said first metal is one of Hf, Zr and Sc.

3. The nitride-based semiconductor light-emitting device according to claim 1, wherein
said second metal is one of Al and Ag.

4. The device according to claim 1, wherein the lint metal enhances adhesion between the substrate and the ohmic electrode.

* * * * *

UNITED STATES PATENT AND TRADEMARK OFFICE
CERTIFICATE OF CORRECTION

PATENT NO. : 7,170,101 B2 Page 1 of 1
APPLICATION NO. : 10/146412
DATED : January 30, 2007
INVENTOR(S) : Masaki Tatsumi et al.

It is certified that error appears in the above-identified patent and that said Letters Patent is hereby corrected as shown below:

In the Claims:

Column 8, line 37, delete "lint" and replace with --first--.

Signed and Sealed this

Eleventh Day of September, 2007

JON W. DUDAS
*Director of the United States Patent and Trademark Office*